(12) United States Patent
Kopacz et al.

(10) Patent No.: US 6,652,656 B2
(45) Date of Patent: Nov. 25, 2003

(54) SEMICONDUCTOR WAFER HOLDING ASSEMBLY

(75) Inventors: Stanislaw Kopacz, Phoenix, AZ (US); John Lawson, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 3 days.

(21) Appl. No.: 09/911,675

(22) Filed: Jul. 24, 2001

(65) Prior Publication Data

US 2003/0019583 A1 Jan. 30, 2003

(51) Int. Cl.[7] .......................... C23C 16/00; B05C 13/02
(52) U.S. Cl. ...................... 118/728; 118/503; 269/128; 414/941; 156/345.1
(58) Field of Search ............................... 118/728, 503; 269/128; 414/941; 156/345.1

(56) References Cited

U.S. PATENT DOCUMENTS

| | | | |
|---|---|---|---|
| 4,523,985 A | 6/1985 | Dimock | 204/298 |
| 4,675,096 A | 6/1987 | Tateishi et al. | 204/298 |
| 4,915,564 A | 4/1990 | Eror et al. | 414/217 |
| 5,046,909 A | 9/1991 | Murdoch | 414/225 |
| 5,192,087 A | 3/1993 | Kawashima et al. | 279/71 |
| 5,372,612 A | 12/1994 | Cronin et al. | 29/25.01 |
| 5,460,703 A | 10/1995 | Nulman et al. | 204/192.12 |
| 5,664,988 A | 9/1997 | Stroupe et al. | 451/41 |
| 5,674,087 A | 10/1997 | Kirma | 439/321 |
| 5,804,042 A | 9/1998 | Ferreira et al. | 204/192.12 |
| 5,810,931 A | 9/1998 | Stevens et al. | 118/721 |
| 5,820,329 A | 10/1998 | Derbinski et al. | 414/225 |
| 5,825,089 A | 10/1998 | Valenti et al. | 257/718 |
| 5,925,226 A | 7/1999 | Hurwitt et al. | 204/298.15 |
| 6,143,147 A | 11/2000 | Jelinek | 204/298.15 |
| 6,258,228 B1 | 7/2001 | Reiss | 204/298.15 |
| 6,299,153 B1 | 10/2001 | Meron et al. | 269/903 |
| 6,536,755 B2 * | 3/2003 | Meron et al. | 269/91 |
| 2002/0030317 A1 * | 3/2002 | Meron et al. | 269/303 |
| 2002/0167122 A1 * | 11/2002 | Meron et al. | 269/91 |

FOREIGN PATENT DOCUMENTS

| | | |
|---|---|---|
| EP | 343502 | 11/1989 |
| EP | 739056 | 10/1997 |
| JP | 7114789 | 5/1995 |

* cited by examiner

Primary Examiner—Alexander Ghyka
(74) Attorney, Agent, or Firm—Wood, Herron & Evans, L.L.P.

(57) ABSTRACT

A semiconductor wafer holding assembly that secures a semiconductor wafer for wafer handling by a semiconductor processing machine. The wafer holding assembly includes a clamp ring that is mounted to a support frame and that has a wafer-engaging surface. A plurality of latch assemblies are mounted about the periphery of the clamp ring and adjacent to the wafer-engaging surface. Each latch assembly includes a latch body that carries a clamping roller assembly and a supporting roller assembly. A rolling element of the supporting roller assembly rolls along a circular path on an inclined surface on the clamp ring as the latch body is rotated through a pivot arc between an unlatched position and a latched position. Unless the latch body is positioned in the latched position, the rolling engagement between the supporting roller assembly and the inclined surface suspends the rolling element of the clamping roller assembly above the wafer surface until the latch body is in the latched position. When the latch body is in the latched position, the rolling element of each clamping roller assembly contacts the wafer surface with a clamping force sufficient to secure the semiconductor wafer in the wafer holder.

34 Claims, 4 Drawing Sheets

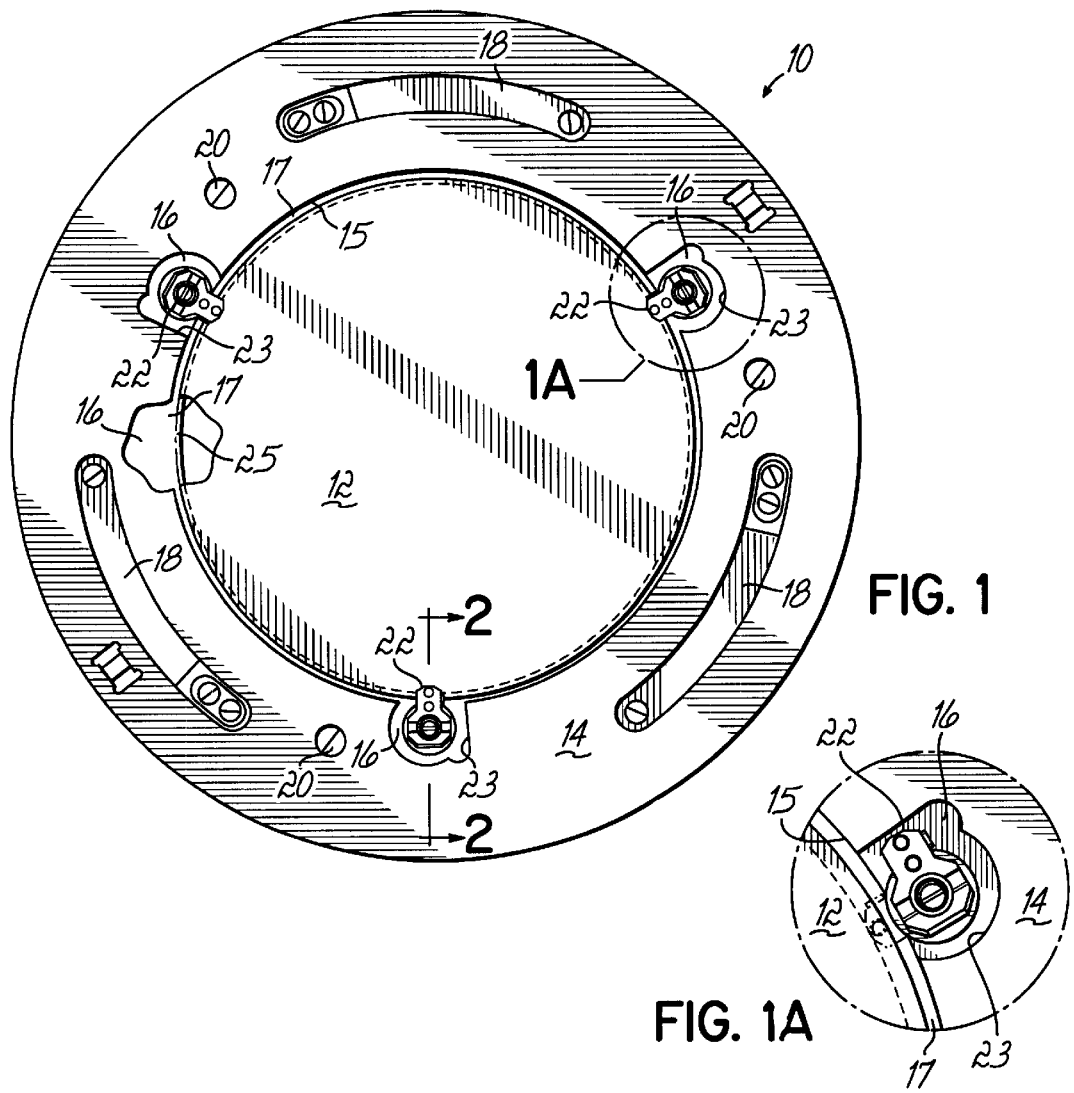
FIG. 1
FIG. 1A
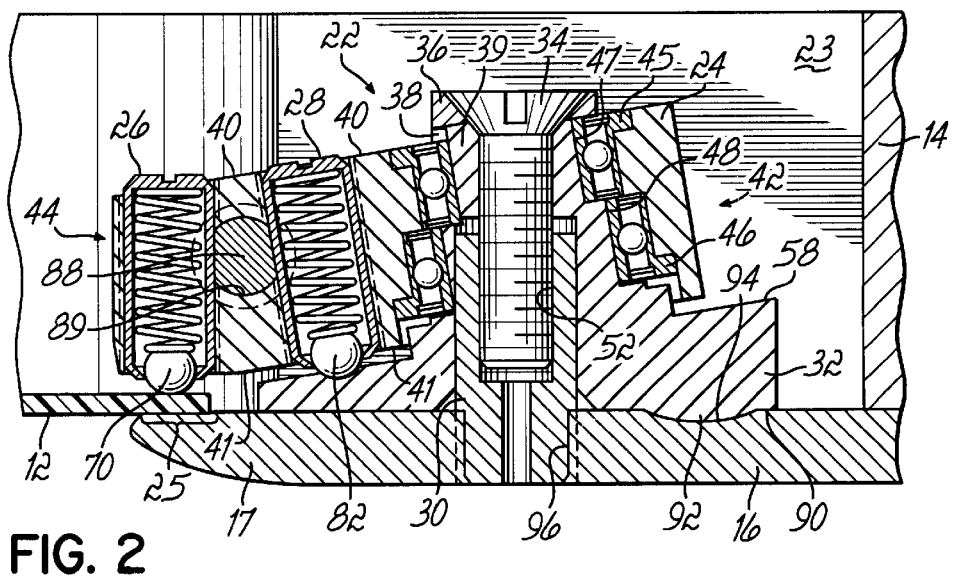
FIG. 2

SEMICONDUCTOR WAFER HOLDING ASSEMBLY

FIELD OF THE INVENTION

This invention relates to semiconductor wafer holding and, in particular, to a wafer holding assembly for securing semiconductor wafers as the wafers are manipulated in a semiconductor processing machine.

BACKGROUND OF THE INVENTION

Semiconductor processing machines are arranged in a semiconductor production line for performing a series of processing steps resulting in the fabrication of integrated circuits in and on a device-side surface of a substrate or semiconductor wafer. Semiconductor processing machines are designed to manipulate and hold a succession of wafers, particularly silicon wafers, within a process chamber during each processing step. As the wafers are manipulated by the processing machine, the wafers are held in various vertical, horizontal, and inverted orientations required by the wafer-handling process of the processing step. The wafers are usually secured in wafer holders that apply a mechanical clamping force which permits non-horizontal manipulation. To limit damage to integrated circuits on the device-side or backside surface treatments of the substrate, wafer holders have been developed that clamp the substrate along a narrow annular ring or exclusion zone inside of the peripheral edge of the wafer. Conventional wafer holders of this type utilize an annular clamp ring and a plurality of moveable latches, which typically contact the wafer only within the exclusion zone, arranged about the circumference of the wafer holder or clamp ring. A conventional latch typically engages the semiconductor wafer with a roller that rolls over the rim of the wafer and across the wafer surface. When the latches are engaged, a clamping force is applied to the wafer surface that captures the semiconductor wafer between the clamp ring and the latches.

Semiconductor wafers are relatively delicate and are susceptible to damage as a result of clamping by the wafer holder. Conventional latches are known to apply an undue latching pressure to the rim of the wafer and the wafer surface. The excessive latching pressure may cause mechanical damage, such as chipping or abrading, as the rollers of the latches roll or slide over the rim of the wafer As the latches move to a latched position, excessive latching pressure applied by the rollers to the surface of the semiconductor wafer may produce scoring or abrasion. Material removed from the semiconductor wafer creates debris assuming the form of small particles. Debris particles residing on the wafer surface during processing produce particulate contamination that adversely affects the operating characteristics of the affected integrated circuits. Moreover, the particle contamination reduces the product yield of functional integrated circuits by rendering affected circuits defective. Particle contamination is believed to be responsible for the vast majority of the product yield loss in a production line. Therefore, it is essential to eliminate possible sources of particles to reduce particle contamination of substrates that would, if unabated, cause defective integrated circuits.

Conventional latches have exposed moving parts, such as the rollers, that tend to accumulate a coating of material from processing steps that apply a layer of a coating material, such as physical vapor deposition. As the coating material accumulates on the moving parts, the latch can experience malfunctions and operational failures. As a result, the process chamber of the semiconductor processing machine must be opened and the affected latch either cleaned or replaced. The maintenance results in lost production time which idles the processing machine and can potentially idle an entire production line during the maintenance.

With growing requirements for improved reliability and increased device yields, an objective of this invention is to provide a latch for use with a wafer holder of a semiconductor processing machine that can secure semiconductor wafers of varying thickness to a clamp ring without damaging or otherwise adversely affecting the wafer surface and that can also minimize particle generation within the process chamber during the latching process.

SUMMARY OF THE INVENTION

The forgoing objective has been accomplished, according to the present invention, by providing a wafer holder for a semiconductor processing machine having a latch assembly that reduces or eliminates the contact pressure or load applied to the wafer rim and the wafer surface as the latch assembly is actuated between unlatched and latched conditions. The wafer holder of the present invention comprises a support frame, a clamp ring attached to the support frame, and plurality of latch assemblies mounted to the clamp ring. The support frame has an inner peripheral edge that defines a first circular opening having a central axis. The first circular opening is diametrically larger than the diameter of the wafer. The clamp ring has a face facing the support frame and an inner peripheral flange defining a second circular opening. The second circular opening is diametrically smaller than the diameter of the wafer and is substantially centered with the central axis. The inner peripheral flange has a wafer-engaging surface for contacting a first surface of the wafer when the wafer is inserted into the first opening and a plurality of inclined surfaces located adjacent the central opening and positioned at spaced angular positions about the central axis. Each of the plurality of inclined surfaces ascends radially outwardly away from the central axis. The plurality of latch assemblies are mounted to the clamp ring at one of the spaced angular positions. Each latch assembly includes a mounting post mounted to the inner peripheral flange of the clamp ring and a latch body rotatably carried on the mounting post. The latch body is rotatable through a pivot arc between a latched position and an unlatched position. A clamping roller assembly and a supporting roller assembly are mounted to the latch body. The clamping roller assembly has a resiliently-biased first rolling element adapted to apply a clamping force to a second surface of the wafer operable to capture the wafer between the rolling element and the wafer-engaging surface of the inner peripheral flange when the latch body is in the latched position. The clamping roller assembly has a resiliently-biased second rolling element that rollingly engages the inclined surface. The rolling engagement between the second rolling element and the inclined surface separates the first rolling element from the second surface of the wafer in a non-contacting manner until the latch body is substantially in the latched position.

According to the present invention, a plurality of latch assemblies of the present invention may be provided as a retrofit kit to replace the existing latch assemblies of a wafer holder. Alternatively, a clamp ring may be included with the plurality of latch assemblies of the present invention as a retrofit kit for a wafer holder to replace the existing clamp ring and latch assemblies. The latch assemblies of the present invention are compatible with the existing hardware and controls of many semiconductor processing machines that may be candidates for the retrofitting operation. As a result, the semiconductor processing machine can be retrofitted with latch assemblies of the present invention without substantial hardware changes and without modifying the control software of the machine.

By virtue of the foregoing, there is provided a latch assembly for a wafer holder that engages and secures a semiconductor wafer for processing. The latch assembly contacts the wafer surface and applies a clamping pressure only when the latch body is angularly proximate the latched position or, preferably, fully in the latched position. As a result, the rolling element of the latch assembly is separated by a gap from the wafer surface as the latch body is rotated between the unlatched and latched positions. Because the latch assembly does not contact the wafer surface unless in or near a latched position, the latch assemblies of the present invention significantly reduce or eliminate particulate matter that would otherwise be created by conventional latch assemblies that abrade and chip the wafer surface. The present invention reduces the force that need be applied to pivotably actuate the latch assemblies by incorporating roller bearings between the latch body and support member. The present invention provides a wafer holding and securing system that is compatible with, and that can be retrofitted to, existing semiconductor processing machines that lack such capabilities. The present invention may be retrofitted to an existing semiconductor processing machine with little or no impact on the hardware of the processing machine and with minimal impact on the operating software of the processing machine.

When holding a semiconductor wafer during a deposition process, the latch assembly of the present invention substantially conceals the rolling elements of the roller assemblies and the roller bearings between the latch body and support member from the flux of coating material depositing on the exposed surface of the wafer. Therefore, the roller assemblies and roller bearings do not require frequent cleaning or replacement.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the invention.

FIG. 1 is a backside perspective view of a wafer holder embodying principles of the present invention, in which the latches of the present invention are illustrated in a latched position.

FIG. 1A is an enlarged perspective view of a portion of the wafer holder of FIG. 1, in which the latches are illustrated in an unlatched position.

FIG. 2 is a cross-sectional view, taken along line 2—2 of FIG. 1, of a latch assembly and clamp ring of the wafer holder of FIGS. 1 and 1A.

DETAILED DESCRIPTION

Figure 3:
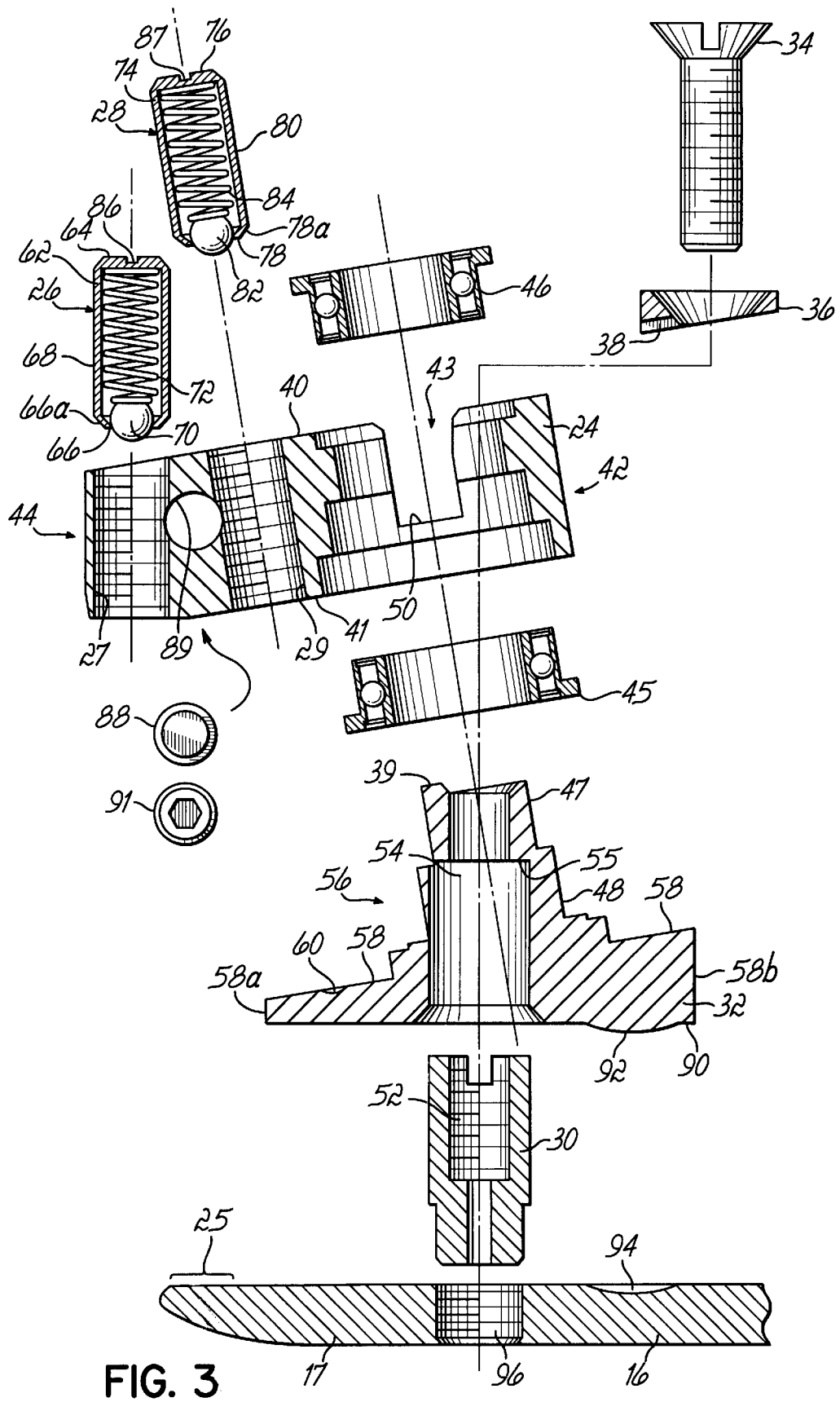
FIG. 3 is an exploded view of the latch assembly and clamp ring of FIG. 2.

The environment of the present invention is a processing machine for semiconductor substrates, such as high-throughput carrousel-type vertical processing machines of the types described in U.S. Pat. Nos. 4,915,564 or 5,516,732, both of which are hereby incorporated by reference herein in their entirety. The present invention is also applicable to other types of processing machines in which the semiconductor substrates remain horizontally and upwardly disposed during manipulation and processing and wafer processing machines in which the wafers are moved through or processed in non-horizontal orientations. However, the described embodiment is particularly suited for non-horizontal semiconductor processing machines and particularly by retrofitting thereto. The semiconductor substrate processed by the semiconductor processing machine may include a wafer, a liquid crystal display, a flat panel display, and/or memory disks. For discussion purposes, and without limitation, reference hereinafer will be made to wafers.

With reference to FIG. 1, an embodiment of a wafer holder 10 according to the present invention is illustrated. The wafer holder 10 is equipped to secure a wafer 12 for manipulation in various non-horizontal orientations within a semiconductor processing machine. The wafer holder 10 is mounted to a carrier, such as an index plate, that moves the holder 10 to a position within the semiconductor processing machine suitable for performing a processing operation, such as a physical vapor deposition which deposits a film of a conducting or insulating coating material onto an exposed surface of wafer 12.

The wafer holder 10 includes a support frame 14 and a clamp ring 16 resiliently mounted to the support frame 14. The clamp ring 16 is biased relative to the support frame 14 by a plurality of, for example, three leaf springs 18 and a plurality of, for example, three coil conical springs 20 arranged with substantially uniform angular spacings about the periphery of the wafer holder 10. The springs 18, 20 collectively urge the clamp ring 16 toward and into contact or proximity with the support frame 14 and the wafer 12 against a plurality of, for example, three latch assemblies 22 having substantially uniform angular spacings about the circumference of the clamp ring 16. Latch assemblies 22 are mounted to clamp ring 16 within cutouts 23 provided in the support frame 14. The support frame 14 has an inner peripheral rim 15 that encircles and defines a substantially circular opening diametrically larger than the outer diameter of the wafer 12 that is to be held in the wafer holder 10 for processing. The clamp ring 16 has an inner peripheral flange 17 encircling and defining a substantially circular opening diametrically smaller than the outer diameter of the wafer 12 that is to be held in the wafer holder 10 for processing. An annular wafer-contacting surface 25 extends about the circumference of the inner peripheral flange 17 and is adapted to contact all or a portion of a peripheral rim of the wafer 12. The annular wafer-contacting surface 25 extends from the inner edge of the inner peripheral flange 17 of the clamp ring 16 over a predetermined radial distance toward but short of the inner edge of the inner peripheral rim 15 of the support frame 14. It is understood by persons of ordinary skill in the art that the annular wafer-contacting surface 25 of clamp ring 16 could be replaced by tabs or the like positioned proximate to the latch assemblies 22. The latch assemblies 22 are positioned radially on the inner peripheral flange 17 so that, when in a latched position, the latch assemblies 22 are operable to capture the wafer 12 against the annular wafer-contacting surface 25 of clamp ring 16 and, when in an unlatched position, no portion of any of the latch assemblies 22 extends past the inner edge of the inner peripheral flange 17.

With reference to FIGS. 2 and 3, each latch assembly 22 includes a latch body 24, a clamping roller assembly 26 and a supporting roller assembly 28 carried by the latch body 24, and a mounting post 30 attached to the clamp ring 16. The clamp ring 18 is provided with a mounting member 32 which is affixed by a threaded fastener 34 and a tapered spacer 36 to the mounting post 30. The tapered spacer 36 includes a keyway 38 that is dimensioned and configured to engage a complementary-shaped key 39 provided on the upper outer periphery of mounting member 32 and, thereby, provide a secure non-rotating engagement therebetween. One side of the tapered spacer 36 abuts an upper surface 40 of the latch body 24 so as to compensate for the inclination of the upper surface 40 relative to the threaded fastener 34 when threadingly engaged with the mounting post 30. A countersunk recess provided on the opposite side of the tapered spacer 36 receives and contacts the complementary-shaped tapered head portion of the threaded fastener 34.

Figure 4:
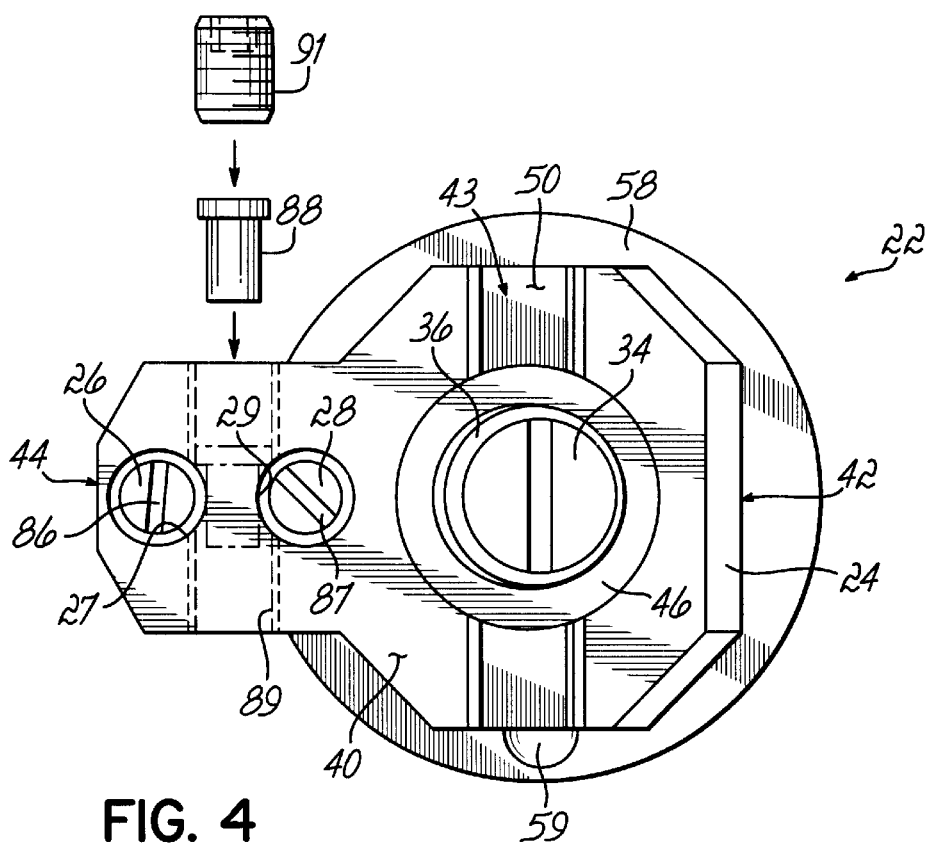
FIG. 4 is a top perspective view of the latch assembly of FIG. 2.

The latch body 24 includes a polygonal portion 42 and an integral tang 44 extending outwardly from one side of the polygonal portion 42, as best shown in FIG. 4. With reference to FIGS. 2 and 3, the polygonal portion 42 of the latch body 24 has a stepped-diameter internal bore 43 which is dimensioned and configured to be mountable to the exterior of mounting member 32. As best shown in FIG. 3, the latch body 24 is pivotally carried on the mounting member 32 by a pair of roller bearings 45, 46 that engage respective inclined cylindrical bearing surfaces 47, 48 provided on the mounting member 32. Each latch body 24 is rotatable about the mounting post 30 through a pivot angle from the latched position, as shown in solid lines in FIG. 1 and in phantom lines in FIG. 1A, to the unlatched position, as shown in solid lines in FIG. 1A. The pivot angle is illustrated in FIG. 1A as being about 90° but is not so limited. The wafer 12 is clamped or latched within the wafer holder 10 when the latch bodies 24 are in the latched position and is unclamped or unlatched when the latch bodies 24 are in the unlatched position. The latch bodies 24 are rotated concurrently between the latched and unlatched positions by a latch actuator mechanism (not shown) when the wafer holder 10 is positioned within a wafer transfer station of the semiconductor processing machine (not shown) and a wafer transfer arm (not shown) is inserting wafer 12 into, or removing wafer 12, from wafer holder 10. The construction and operation of a latch actuator mechanism, consistent with aforementioned latch actuator mechanism, is more particularly described in U.S. Pat. No. 4,915,564, referred to above, and U.S. Pat. No. 5,820,329, which is hereby incorporated by reference herein in its entirety.

The topside of the polygonal portion 42 of each latch body 24 includes a slot 50, best shown in FIG. 4, dimensioned and configured to receive an engagement finger of the latch actuator mechanism (not shown) for mechanically coupling the latch assembly 22 with the latch actuator mechanism. With reference to FIGS. 1 and 1A, the slot 50 is oriented in the polygonal portion 42 such that slot 50 is generally aligned tangentially with respect to the circumference of the clamp ring 16 when the latch assemblies 22 are in the latched position and are generally aligned radially toward the center of the clamp ring 16 when the latch assemblies 22 are in the unlatched position, although the present invention is not so limited. The number of latch assemblies 22 is equal to the engagement fingers, which are positioned about the latch actuator mechanism so as to engage simultaneously the slot 50 of each latch body 24 for rotary movement of the latch assemblies 22 in unison between the latched and unlatched positions. The cut-outs 23 are shaped and dimensioned so that each latch body 24 can be rotated between the latched and unlatched positions without contacting support frame 14.

In use to load the wafer holder 10, the engagement fingers of the latch actuator mechanism are mechanically coupled with the slot 50 of each latch assembly 22 and the latch bodies 24 are rotated in unison to the unlatched position. The wafer transfer arm inserts wafer 12 into the wafer holder 10 and presses the wafer 12 against the clamp ring 16 to displace it axially from the support frame 14. The latch actuator mechanism rotates the latch bodies 24 in unison to the latched position and the wafer transfer arm is withdrawn. When the latch bodies 24 are in the latched position, the wafer 12 is captured with a clamping force between each latch assembly 22 and the clamp ring 16. Specifically, the annular wafer-contacting surface 25 of the clamp ring 16 contacts an annular portion of the peripheral rim of the wafer 12 and each clamping roller assembly 26 bears against the opposite side of the wafer 12 at a contact point and with a contact pressure. The wafer transfer arm releases the wafer 12, now secured by the wafer holder 10, and withdraws from the wafer transfer station.

In use to unload the wafer holder 10, the wafer transfer arm engages wafer 12 held by the wafer holder 10 and presses the wafer 12 against the clamp ring 16 to displace it axially from the support frame 14. The engagement fingers of the latch actuator mechanism are mechanically coupled with the latch assemblies 22. The latch bodies 24 are rotated from the latched position to the unlatched position to release the clamping force applied to the wafer 12 and free the wafer 12 for removal from the wafer holder 10. When the latch bodies 24 are in the unlatched position and no longer obstruct the central opening of the wafer holder 10, the wafer transfer arm engages the wafer 12 and withdraws from the wafer transfer station.

With continued reference to FIGS. 2 and 3, the mounting post 30 may be configured to attach to and release from the clamp ring 16, such as by the illustrated threaded interconnection. Alternatively, the mounting post 30 can be affixed to the clamp ring 16 in a non-removable fashion, such as by a welded junction. The threaded fastener 34 is received in the internal bore 43 of the latch body 24 and fastened to a vented, internally threaded portion 52 of the mounting post 30. The latch body 24 and mounting member 32 can be removed from the wafer holder 10 by unfastening the threaded fastener 34 from threaded portion 52 and removing the spacer 36 and the fastener 34 to release the latch body 24 and mounting member 32. The latch body 24 and mounting member 32 are formed of a stainless steel, such as 316L stainless steel, or a machinable ceramic, such as Macor®.

The mounting member 32 includes a stepped-diameter inner bore 54 and a terraced or stepped-diameter outer surface 56. The inner bore 54 has a diametrically-enlarged portion dimensioned to receive the mounting post 30, a shoulder 55 that abuts a top surface of the mounting post 30, and a diametrically-reduced portion dimensioned to receive the threaded fastener 34. The terraced outer surface 56 includes an upwardly-facing annular inclined surface or ramp 58 extending about the circumference of the mounting member 32. The ramp 58 ascends in a radially outward direction from a minimum-height inner edge 58a (FIG. 3), peripherally nearest to the opening defined by the inner peripheral flange 17, to a maximum-height outer edge 58b at a diametrically opposed location. The ramp 58 has a slope, defined as the change in height per unit radial distance, in the radially-outward direction with respect to the plane containing the wafer-contacting surface 25. Rotation of the latch body 24 about the mounting post 30, with the supporting roller assembly 28 rollingly engaged with the ramp 58 and traversing a circular path thereupon, is converted to a vertical movement of the clamping roller assembly 26 relative to the surface of wafer 12. As a result, the elevation of the clamping roller assembly 26 decreases, relative to a plane containing the surface of the wafer 12, as the latch body 24 is rotated from the unlatched position to the latched position. Because the ramp 58 has a relatively shallow slope, the range of axial movement of the clamping roller assembly 26 is small compared to the length of the circular path that the supporting roller assembly 28 traverses along ramp 58. The ramp 58 is sloped outwardly at an acute angle and, in one embodiment, an angle of about 10° is suitable to produce the requisite vertical movement of the clamping roller assembly 26.

The clamping roller assembly 26 and the supporting roller assembly 28 are mounted in a spaced-apart relationship to the tang 44 of the latch body 24. The clamping roller assembly 26 includes a hollow thin-walled cylindrical sleeve 62 having a closed end 64, an open end 66 opposite the closed end 64, and a cylindrical outer surface 68 extending between the closed end 64 and the open end 66. A rolling element 70 and a compression spring 72 are disposed inside the sleeve 62. The exterior cylindrical surface 68 of the sleeve 62 is dimensioned and configured to be threadingly received in a threaded bore 27 in tang 44. When the clamping roller assembly 26 is installed in latch body 24, sleeve 62 has a longitudinal axis slightly inclined from the surface normal of the upper surface 40. When the latch body 24 is in the latched position and engaged with the surface of wafer 12, the longitudinal axis of the sleeve 62 of clamping roller assembly 26 is oriented substantially perpendicular to the annular wafer-engaging surface 25 and to the facing surface of wafer 12.

The supporting roller assembly 28 includes a hollow thin-walled cylindrical sleeve 74 having a closed end 76, an open end 78 opposite the closed end 76, and a cylindrical outer surface 80 extending between the closed end 76 and the open end 78 rolling element 82 and a compression spring 84 are disposed inside the sleeve 74. The exterior cylindrical surface 80 of sleeve 74 is dimensioned and configured to be threadingly received in a threaded bore 29 provided in tang 44. When the supporting roller assembly 28 is installed in threaded bore 29, sleeve 74 has a longitudinal axis oriented generally perpendicular to the ramp 58 for any orientation of the latch body 24 between the unlatched and latched positions. Threaded bore 29 is inclined at an angle relative to threaded bore 27, as best shown in FIG. 3, so that the supporting roller assembly 28 has a centerline that is likewise inclined at an angle relative to a centerline of the clamping roller assembly 26. In other words, the centerlines of the supporting roller assembly 28 and the clamping roller assembly 26 are not parallel.

The threaded bores 27, 29 are linearly aligned along the horizontal centerline of the tang 44, referenced with respect to the vertical centerline of the mounting post 30, and extend through the tang 44 between the upper surface 40 and a lower surface 41. With reference to FIGS. 3 and 4, a headed cylindrical retainer 88 is received in a cylindrical threaded hole 89 provided in the side of the tang 44. The threaded hole 89 is oriented perpendicular to the threaded bores 27, 29 and has a diametrical dimension sized to slidingly receive the head and the shank of retainer 88. Respective portions of the head of retainer 88 contact the exterior cylindrical surface 68 of sleeve 62 and the exterior cylindrical surface 80 of sleeve 74, as shown in dashed lines in FIG. 4. A threaded fastener 91, such as, for example, a set screw, is threadingly received within the threaded hole 89, after retainer 88 is inserted therein. The threaded fastener 91 is advanced axially within threaded hole 89 to contact and apply a retaining force against the head of retainer 88, which is transferred by the head of the retainer 88 to respective portions of surfaces 68, 80. When the retaining force is applied against applied surfaces 68, 80, sleeves 62, 74 are not rotatable. The restraining force is applied after the axial positions of rollers 26, 28 are adjusted within the respective threaded bores 27, 29 to provide the desired clamping force and to provide the initial angle of the total pivot arc at which rolling engagement between rolling element 70 and the surface of wafer 12 occurs.

With reference to FIGS. 2 and 3, the open end 66 of sleeve 62 has a frustoconical inwardly-tapered rim 66a for retaining the rolling element 70 within the sleeve 62 and, in particular, to retain the rolling element 70 within the sleeve 62 when the latch body 24 is not in the latched position. Likewise, the open end 78 of sleeve 74 has a frustoconical inwardly-tapered rim 78a for securing the rolling element 82 within the sleeve 74. The rolling elements 70, 82 are generally spherical and have a diametric dimension which is larger than the diameter of the opening surrounded by the respective tapered rim 66a, 78a but less than the inner diameter of the respective sleeve 62, 74. As a result, an exposed portion of the spherical surface of each rolling element 70, 82, which is less than half of the surface area, projects beyond a plane which includes the respective tapered rim 66a, 78a and also projects beyond the lower surface 41.

The rolling elements 70, 82 are preferably formed of a metal, such as a stainless steel, titanium or tungsten. For applications involving high-temperature securement of wafer 12, the rolling elements 70, 82 may be formed of a ceramic, such as an alumina. The rolling element 70 of the clamping roller assembly 26 preferably has a controlled surface roughness selected to minimize abrasive wear of the surface of wafer 12. It is understood that the rolling elements 70, 82 are not limited to having identical constructions.

The compression springs 72, 84 are disposed in a compressed state within the interior of the respective sleeve 62, 74. One end of compression spring 72 contacts the interior of the closed end 64 and the opposite end of the compression spring 72 is dimensioned and configured to contact rolling element 70. The compression spring 72 resiliently biases the rolling element 70 with an axial spring force arising from the compression of the spring 72 between the closed end 64 and the contact with the rolling element 70. The axial spring force applied by spring 72 to the rolling element 70 is generally directed parallel to the longitudinal axis of the sleeve 62. Similarly, one end of compression spring 84 contacts the interior of the closed end 76 and the opposite end of the compression spring 84 is dimensioned and configured to contact rolling element 82. The compression spring 84 resiliently biases the rolling element 82 with an axial spring force arising from the compression of the spring 84 between the closed end 76 and the contact with the rolling element 82. The axial spring force applied to the rolling element 82 is generally directed parallel to the longitudinal axis of the sleeve 74. The characteristics of each compression spring 72, 84, such as stiffness, are selected to provide an axial spring force suitable for capturing a wafer 12 in the wafer holder 10 and repeatedly performing latching and unlatching operations without experiencing a significant deterioration in elastic properties. It is understood that the characteristics of the compression springs 72, 84 may differ.

When the latch assembly 22 is in the latched position, the clamping roller assembly 26 of each latch body 24 applies a clamping force, preferably uniform, at each point of securement, against the surface of wafer 12. The clamping force secures the wafer 12 against the annular wafer-engaging surface 25 of clamp ring 16. As discussed below, the clamping force is only applied to the surface of the wafer 12 when the latch body 24 is in the latched position and rolling element 70 is contacting the surface of wafer 12. The clamping force exerted by the clamping roller assembly 26 of each latch assembly 22 has a magnitude effective to secure the wafer 12 within wafer holder 10 without causing significant mechanical stress to the surface of wafer 12 that could induce damage. A suitable clamping force has a magnitude on the order of about 1.0 pounds to about 1.5 pounds, which is distributed over the area of contact between rolling element 70 and the surface of wafer 12.

The clamping roller assembly 26 and the supporting roller assembly 28 are individually and independently threadingly movable, relative to the tang 44, in an axial direction within their respective threaded bores 27, 29. To that end, the outside of the closed end 64 of clamping roller assembly 26 includes an engagement structure 86 that is configured and dimensioned to receive a complementary shaped end of a tool, which can be used to apply a rotational force or torque to threadingly move roller 26. Likewise, the outside of the closed end 76 of supporting roller assembly 28 includes an engagement structure 87 similarly dimensioned and configured. For example, the engagement structures 86, 87 may be slots that receive the end of a flat-tipped screwdriver. Accordingly, supporting roller assembly 28 can be advanced or withdrawn axially relative to ramp 58, the clamping roller assembly 26 can be advanced or withdrawn axially toward the upper surface 40, or a combination thereof.

The axial position of rolling element 82 against ramp 58 is adjusted so that the rolling element 82 is deflected axially and unseated from the tapered rim 78a. Accordingly, the rolling element 82 rollingly engages the ramp 58 over the entire pivot angle of latch body 24 between the latched and unlatched positions. In the unlatched position, the rolling element 82 of the supporting roller assembly 28 is substantially centered in a cusped detent 59 provided on the ramp 58. In the latched position, the rolling element 82 of the supporting roller assembly 28 is substantially centered in a cusped detent 60 provided on the ramp 58 at a spaced angular position about 90° from cusped indent 59. The axial spring force applied against ramp 58 is of a magnitude such that the turning force applied by latch actuator mechanism is minimized in order to rotate the latch body 24 about the mounting member 32 and mounting post 30, while also permitting rolling element 82 to be secured in each of the cusped detents 59, 60 so that the latch body 24 is stabilized against rotation when the latch actuator mechanism is mechanically decoupled from the latch assembly 22.

The rolling engagement of the rolling element 82 against ramp 58 elevates the rolling element 70 of the clamping roller assembly 26 a varying distance above the surface of the wafer 12, for those angular positions of the pivot angle overlying the wafer 12, until the latch body 24 nears the latched position. The elevation distance at each angular position of the pivot angle is a function of the slope of ramp 58 and the axial position of the clamping roller assembly 26.

As the latch body 24 rotates through the portion of the pivot angle near latched position, the separation between the rolling element 70 and the surface of wafer 12 decreases until the rolling element 70 contacts the surface of wafer 12. Upon contact, the rolling element 70 is displaced vertically or axially against the axial spring force applied by the compression spring 72 and is freed from its non-rolling engagement with tapered rim 66a of the sleeve 62. When the latch body 24 is in the latched position, rolling element 70 applies a clamping force to the surface of wafer 12 substantially equal to the axial spring force applied to the rolling element 70 by compression spring 72. As the latch body 24 is rotated through the pivot angle from the latched position to the unlatched position, the elevation of the roller element 70 of clamping roller assembly 26 increases relative to the plane containing the surface of the wafer 12. When the rolling element 70 is elevated out of contact with the surface of wafer 12, the clamping force is removed.

The clamping force represents the maximum load applied by rolling element 70 to the surface of wafer 12 during the transition between latched and unlatched positions. Rolling element 70 can rollingly engage the surface of wafer 12 when unseated from tapered rim 66a. Preferably, as the latch body is rotating between the latched and unlatched positions, the arc length of rolling engagement of the rolling element 70 with the surface of wafer 12 is minimized by adjusting the axial position of the clamping roller assembly 26 accordingly. Specifically, the axial position of the clamping roller assembly 26 is adjusted, according to the thickness of the wafer 12 and should be less than about three angular degrees of the latched position. An advancement in the axial position of the clamping roller assembly 26 accommodates wafers 12 that are relatively thin and a withdrawal in the axial position of roller 26 accommodates wafers 12 that are relatively thick. Most preferably, the axial position of the clamping roller assembly 26 is adjusted such that rolling element 70 contacts the surface of the wafer 12 only when the rolling element 82 of the supporting roller assembly 28 rolls into or out of the shallow cusped detent 60 in the ramp 58. As a result, the rolling engagement between rolling element 70 and the surface of wafer 12 is limited to an arc length which is less than about one angular degree.

With continued reference to FIGS. 2 and 3, a bottom disk-shaped surface 90 of the mounting member 32 can be provided with a securement element 92 which is configured and dimensioned to engage a complementary securement element 94 provided in, or on, the surface of the clamp ring 16. The engagement between the securement elements 92, 94 can provide additional stability to the latch assembly 22 for resisting rotation of the mounting member 32 about the mounting post 30 as the latch bodies 24 are rotated between the latched and unlatched positions. In FIGS. 2 and 3, the securement element 92 is illustrated as a curved projection extending below the plane of bottom surface 90 and the securement element 94 is illustrated as a round cusped detent recessed below an upper surface of clamp ring 16. However, the present invention is not so limited and the securement elements 92 and 94 may assume other complementary configurations suitable for securing mounting member 32 from rotation about mounting post 30 when the latch body 24 is in a latched position. It is understood that securement element 92 can be tailored to conform to a pre-existing securement element 94 on the surface of existing clamp ring 16 in a situation in which the latch assembly 22 of the present invention is being retrofitted to a clamp ring 16 after removal of the conventional latch assembly (not shown).

The assembly and installation of one of a plurality of latch assemblies 22 to the clamp ring 16 is illustrated with reference to FIG. 3. If the clamp ring 16 is provided with a threaded aperture 96, the mounting post 30 is threadingly fastened into the aperture 96. In certain clamp rings 16, the mounting post 30 may be affixed to clamp ring 16 by, for example, a welded junction rather than the threaded fastening illustrated in FIG. 3. If the mounting member 32 has a securement element 92, the mounting member 32 is positioned on the mounting post 30 and oriented with the securement element 92 engaged with securement element 94 on the clamp ring. If the mounting member 32 lacks a securement element 92, the latch assemblies 22 are oriented in a rotationally consistent manner with all latch assemblies 22 initially in either the latched position or in the unlatched position. The roller bearing 45 is positioned against the bearing surface 48 of the mounting member 32, the latch body 24 is positioned on the mounting member 32, and the roller bearing 46 is positioned against bearing surface 47. The tapered spacer 36 is positioned proximate to the top of the mounting member 32 with the keyway 38 engaging the key 39. The threaded fastener 34 is engaged with the threaded opening 52 in the mounting post 30 and an engagement torque is applied to fastener 34 for capturing the assembled components positioned on the mounting post 30. The clamping roller assembly 26 and the supporting roller assembly 28 can be pre-installed in the respective threaded bores 27, 29 of tang 44 either before or after assembly and attachment to clamp ring 16. The rollers 26, 28 are positioned axially within the respective threaded bores 27, 29 and the rollers 26, 28 are secured at those axial positions via the retainer 88.

Figure 5:
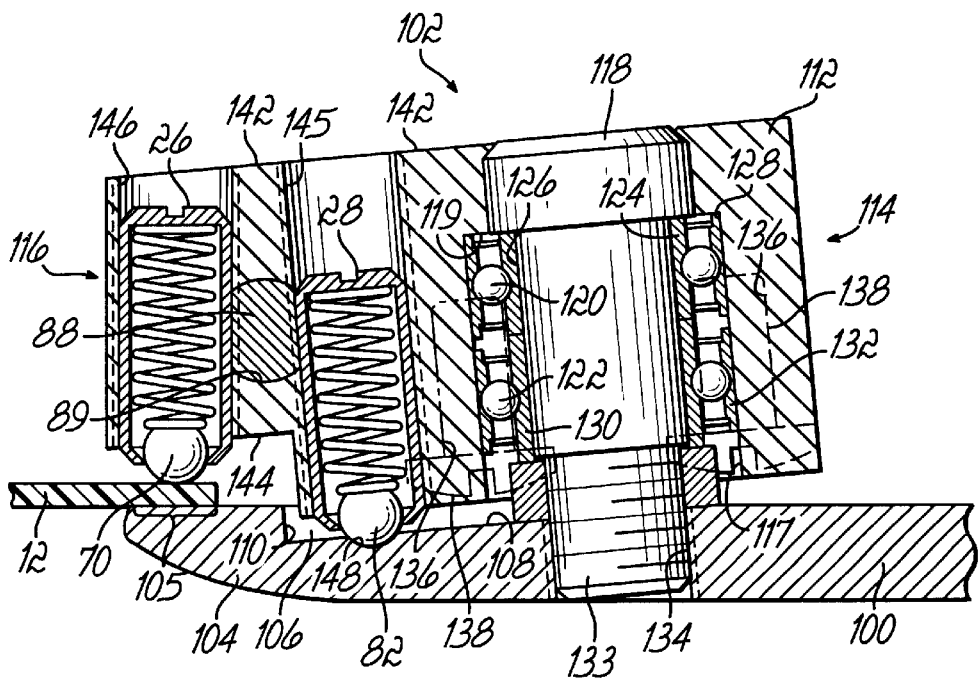
FIG. 5 is a cross-sectional view of an alternative embodiment of a latch assembly and clamp ring according to the present invention.
Figure 6:
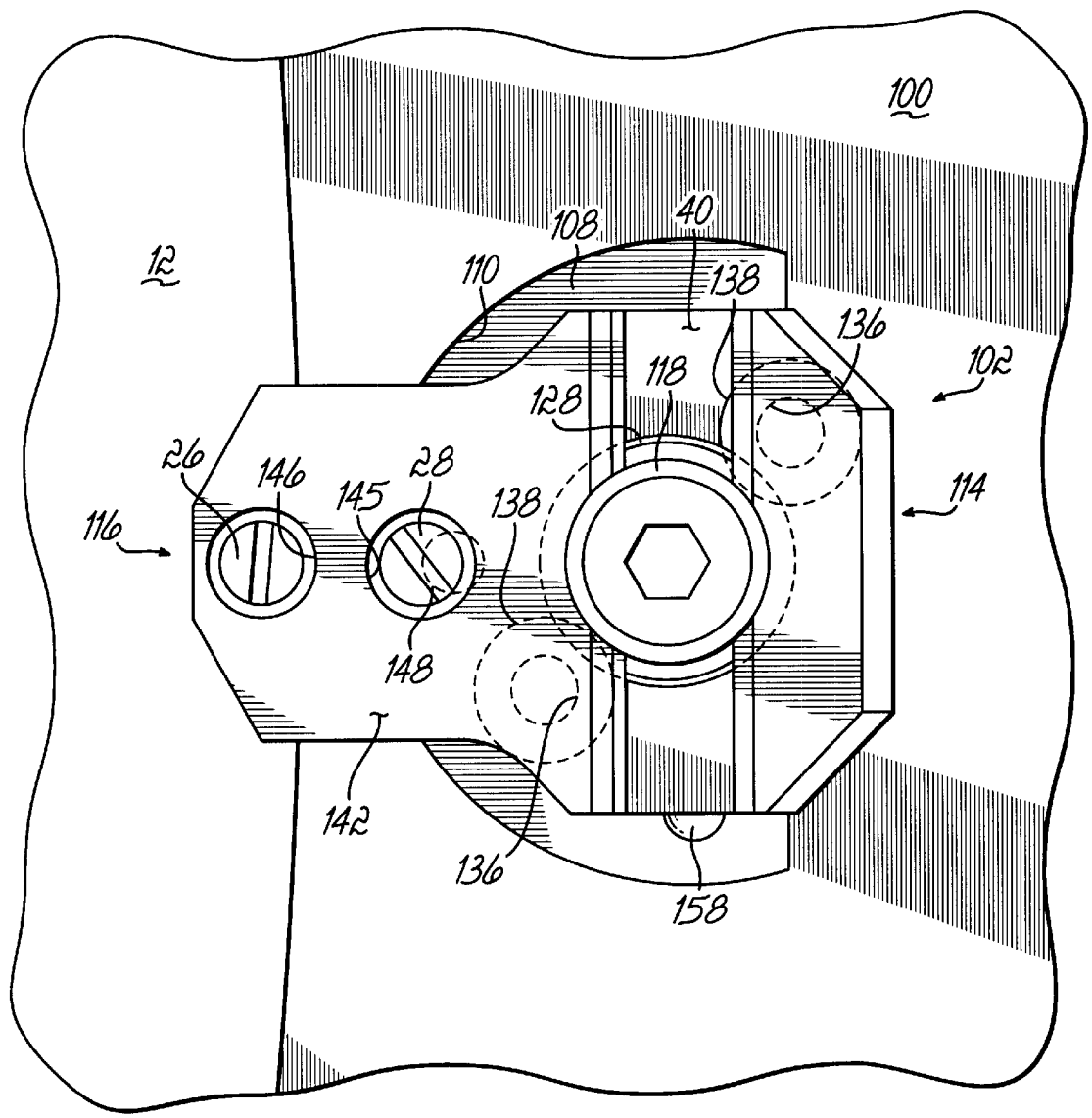
FIG. 6 is a top perspective view of the latch assembly and clamp ring of FIG. 5.

With reference to FIGS. 5 and 6 in which like reference numerals refer to like features in FIGS. 1–4, a clamp ring 100 and a latch assembly 102 are illustrated according to an alternative embodiment of the present invention. The clamp ring 100 is resiliently mountable to support frame 14 (FIG. 1). The clamp ring 100 includes an inner peripheral flange 104 having an annular wafer-engaging surface 105 that is adapted to contact all or a portion of a peripheral rim of wafer 12. The clamp ring 100 is provided with a plurality of an upwardly-facing circular recesses, of which circular recess 106 is shown in FIGS. 5 and 6. Each of the plurality of circular recesses 106 is centrally located in one of the cutouts 23 provided in the support frame 14 and, as a result, recesses 106 have an angularly spaced relationship about the periphery of the clamp ring 100.

Circular recess 106 has a bottom surface 108 that slopes in a radially-outward direction relative to a plane containing the wafer-engaging surface 105 and a side surface 110 that extends upwardly from the bottom surface 108. The bottom surface 108 ascends in the radially-outward direction from an inward portion of side surface 110, peripherally nearest to the opening defined by the inner peripheral flange 104, so that the depth of the circular recess 106 is a function of the radial distance from the vertical centerline of the clamp ring 100. The bottom surface 108 is sloped outwardly at an acute angle and, in one embodiment, bottom surface 108 slopes outwardly at about 10°.

Latch assembly 102 is one of a plurality of, for example, three latch assemblies provided with a spaced angular relationship about the circumference of the clamp ring 100 and located in one of the cutouts 23 provided in the support frame 14 (FIG. 1). Latch assembly 102 includes a latch body 112 having a polygonal portion 114 and an integral tang 116 extending outwardly from one side of the polygonal portion 114. The latch body 112 is pivotally carried on a mounting post 118 which extends outwardly from the clamp ring 100 at an inclined angle. Similar to latch body 24 (FIGS. 1–4), each latch body 112 is rotatable about the mounting post 118 through a pivot angle between latched and unlatched positions, similar to the latched and unlatched positions shown in FIGS. 1 and 1A, respectively.

The mounting post 118 is dimensioned and configured to be insertable into a cylindrical bore 117 extending through the polygonal portion 114 of the latch body 112. An upper roller bearing 120 and a lower roller bearing 122 are positioned between the interior of the cylindrical bore 117 and the exterior of the mounting post 118. the pair of ball roller bearings significantly reducing the amount of force need to rotate each latch body between the latched position and the unlatched position. Upper roller bearing 120 has an inner race 124 that engages a portion of a cylindrical bearing surface 126 provided on the shank of the mounting post 118 and an outer race 128 that contacts an interior portion of the counterbore 117. The outer race 128 abuts against an annular shoulder 119 provided in cylindrical bore 117. Lower roller bearing 122 has an inner race 130 that engages the cylindrical bearing surface 126 and an outer race 132 that contacts an interior portion of the cylindrical bore 117. The head of the mounting post 118 applies a vertically downward fastening force against the inner race 132, which abuts the inner race 124 of the upper roller bearing 120. The shank of the mounting post 118 also has a threaded portion 133 that is threadingly received in an internally threaded aperture 134 provided in the bottom surface 108, which fastens the latch body 112 to the clamp ring 100.

The underside of the polygonal portion 114 of the latch body 112 has a pair of blind bores 136 arranged symmetrically about the cylindrical bore 117. A headed fastener 138 is threadingly received within each of the pair of blind bores 136. When tightened, the head of each headed fastener 138 abuts against the outer race 132 of the lower roller bearing 122 so that the upper roller bearing 120 and the lower roller bearing 122 receive a pre-pressure or force acting in the vertical direction. Therefore, the pre-pressure applied by the headed fasteners eliminates vertical play of the roller bearings 120, 122 relative to the latch body 112.

The latch body 112 of the latch assembly 102 is adapted to coact with the semiconductor processing machine at a wafer transfer station to cause securement of the wafer 12. To that end, the topside of the polygonal portion 114 of the latch body 112 includes a slot 140 (FIG. 6) which is dimensioned and configured to receive an engagement finger of a latch actuator mechanism (not shown), as described above with regard to latch body 24. The latch actuator mechanism is operable to rotate the latch body 112 between the latched and unlatched positions.

The tang 116 of the latch body 112 includes a spaced-apart pair of threaded bores 145, 146 that extend through the tang 44 between an upper surface 142 and a lower surface 144. The clamping roller assembly 26 and the supporting roller assembly 28, described above, are individually and independently threadingly movable, relative to the tang 116, in an axial direction within their respective threaded bores 145, 146. The axial positions of the clamping roller assembly 26 and the supporting roller assembly 28 are adjusted such that rolling element 70 contacts the surface of the wafer 12 only when the rolling element 82 rolls into or out of a shallow cusped detent 148 in the bottom surface 108. When latch body 112 is in the latched position, the rolling element 82 is received and substantially centered in cusped detent 150. When latch body 112 is in the unlatched position, the rolling element 82 is received and substantially centered in a second shallow cusped detent 150 provided in the bottom surface 108 of circular recess 106 at an angular position spaced about 90° from cusped indent 148. Headed cylindrical retainer 88, as described above, is used to prevent unintentional rotation of either the clamping roller assembly 26 or the supporting roller assembly 28 after they are axially positioned.

Rotation of the latch body 112 about the mounting post 118, with the supporting roller assembly 28 rolling engaged with the bottom surface 108 and traversing a circular path thereupon, is converted to a vertical movement of the clamping roller assembly 26 relative to the surface of wafer 12. As a result, the elevation of the clamping roller assembly 26 decreases, relative to a plane containing the surface of the wafer 12, as the latch body 24 is rotated through the pivot angle from the unlatched position to the latched position. Because the bottom surface 108 has a relatively shallow slope, the range of axial movement of the clamping roller assembly 26 is small compared to the length of the circular path of the supporting roller assembly 28 about the ramp 58.

The latch assembly 102 operates in the same manner as the latch assembly 22 for securing wafer 12 within wafer holder 10 when the latch body is oriented in the latched position and releasing wafer 12 when latch body is oriented in the unlatched position. Rotation of the latch body about the mounting post 118, with the supporting roller assembly 28 rolling engaged with the bottom surface 108 and traversing a circular path thereupon, is converted to an axial movement of the clamping roller assembly 26 relative to the surface of wafer 12. As a result, the elevation of the roller element 70 of clamping roller assembly 26 decreases, relative to a plane containing the surface of the wafer 12, when the latch body 112 is rotated from the unlatched position to the latched position. In the latched position, the roller element 70 of the clamping roller assembly 44 applies a clamping force to a surface of wafer 12 that is opposite to the surface of wafer 12 that is contacting the wafer-engaging surface 105. Similarly, the elevation of the clamping roller assembly 26 increases, relative to the plane containing the surface of the wafer 12, when the latch body 24 is rotated from the latched position to the unlatched position. When the roller element 70 is elevated above the surface of wafer 12, the clamping force is removed and the roller element 70 does not apply a load to the surface of wafer 12.

While the present invention has been illustrated by the description of embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope or spirit of applicant's general inventive concept.

Accordingly, what is claimed is:

1. A latch assembly for a clamp ring attachable to a wafer holder, the clamp ring including an inner peripheral flange defining a circular opening, the circular opening having a central axis and being diametrically smaller than the diameter of a wafer to be held by the wafer holder, the inner peripheral flange having a wafer-engaging surface for contacting a first surface of the wafer, and the clamp ring having an inclined surface positioned adjacent the central opening, the inclined surface ascending radially outwardly away from the central axis, the latch assembly comprising:

a mounting post mountable to the inner peripheral flange of the clamp ring;

a latch body rotatably carried on said mounting post, said latch body rotatable through a pivot arc between a latched position and an unlatched position;

a clamping roller assembly mounted to said latch body, said clamping roller assembly having a resiliently-biased first rolling element adapted to apply a clamping force to a second surface of the wafer operable to capture the wafer between said first rolling element and the wafer-engaging surface of the inner peripheral flange when said mounting post is mounted to the clamp ring and when said latch body is in the latched position; and a supporting roller assembly mounted to said latch body and having a resiliently-biased second rolling element that rollingly engages the inclined surface when said mounting post is mounted to the clamp ring, wherein the rolling engagement between said second rolling element and the inclined surface separates said first rolling element from the second surface of the wafer in a non-contacting manner until said latch body is substantially in the latched position.

2. The latch assembly of claim 1, wherein said first rolling element is a spherical ball and said clamping roller assembly includes a compression spring and a thin-walled sleeve, said sleeve having a closed end, a frustoconical inwardly-tapered open end and a hollow interior extending longitudinally between said open and closed ends, said spherical ball captured within said hollow interior and engaging said open end, and said compression spring positioned within said hollow interior between said closed end and said spherical ball for applying an axial spring force to said spherical ball directed substantially parallel to a longitudinal axis of said sleeve, wherein contact with the second surface of the wafer deflects said spherical ball against the axial spring force from engagement with said open end to thereby apply a clamping force against the second surface of the wafer when said mounting post is mounted to the clamp ring.

3. The latch assembly of claim 1, wherein said second rolling element is a spherical ball and said supporting roller assembly includes a compression spring and a thin-walled sleeve, said sleeve having a closed end, a frustoconical inwardly-tapered open end, and a hollow interior extending longitudinally between said open and closed ends, said spherical ball captured within said hollow interior and engaging said open end, and said compression spring positioned within said hollow interior between said closed end and said spherical ball for applying an axial spring force to said spherical ball directed substantially parallel to a longitudinal axis of said sleeve, said spherical ball being deflected against the axial spring force from engagement with said open end to rollingly engage the inclined surface when said mounting post is mounted to the clamp ring.

4. The latch assembly of claim 1, wherein said mounting post is removably mountable to the inner peripheral flange of the clamp ring.

5. The latch assembly of claim 1, wherein said rolling element of said clamping roller assembly engages the second surface of the wafer over an arc length of less than about three angular degrees of the pivot arc near the latched position.

6. The latch assembly of claim 5, wherein said rolling element of said clamping roller assembly engages the second surface of the wafer over an arc length of less than about one angular degree of the pivot arc near the latched position.

7. The latch assembly of claim 1, wherein the position of said clamping roller assembly is axially adjustable within said latch body relative to a plane containing the wafer, the axial position being adjusted according to the thickness of the wafer to be held for minimizing the arc length of the pivot arc over which said rolling element of said clamping roller assembly applies a clamping force to the second surface of the wafer.

8. The latch assembly of claim 1, wherein the position of said supporting roller assembly is axially adjustable within said latch body relative to a plane containing the inclined surface, the axial position being adjusted so that said first rolling element is rollingly engaged with the inclined surface when said mounting post is mounted to the clamp ring.

9. The latch assembly of claim 1, further comprising a pair of ball bearings disposed between said mounting post and said latch body, said pair of ball bearings significantly reducing the amount of force need to rotate said latch body between the latched position and the unlatched position.

10. The latch assembly of claim 1, wherein said clamping roller assembly and said clamping roller assembly are individually and independently movable relative to said latch body.

11. A clamp ring assembly for a wafer holder of a semiconductor processing machine, the wafer holder having a support frame with an inner peripheral edge defining a first circular opening, the first circular opening being diametrically larger than the diameter of the wafer, the clamp ring assembly comprising:
  a clamp ring adapted to be attached to the support frame, said clamp ring having a face facing the support frame and an inner peripheral flange defining a second circular opening, said second circular opening being diametrically smaller than the diameter of the wafer and and having a central axis being substantially centered with the first circular opening, said inner peripheral flange having a wafer-engaging surface for contacting a first surface of the wafer when the wafer is inserted into the first circular opening and a plurality of inclined surfaces located adjacent said second central opening and positioned at spaced angular positions about said central axis, each of said plurality of inclined surfaces ascending radially outwardly away from said central axis; and
  a plurality of latch assemblies mounted to said clamp ring at one of said spaced angular positions, each of said plurality of latch assemblies including:
    a mounting post mounted to said inner peripheral flange of said clamp ring;
    a latch body rotatably carried on said mounting post, said latch body rotatable through a pivot arc between a latched position and an unlatched position;
    a clamping roller assembly mounted to said latch body, said clamping roller assembly having a resiliently-biased first rolling element adapted to apply a clamping force to a second surface of the wafer operable to capture the wafer between said first rolling element and said wafer-engaging surface of said inner peripheral flange when said latch body is in the latched position; and
    a supporting roller assembly mounted to said latch body and having a resiliently-biased second rolling element that rollingly engages one of said plurality of inclined surfaces, wherein the rolling engagement between said second rolling element and said inclined surface separates said first rolling element from the second surface of the wafer in a non-contacting manner until said latch body is substantially in the latched position.

12. The clamp ring assembly of claim 11, wherein said first rolling element is a spherical ball and said clamping roller assembly includes a compression spring and a thin-walled sleeve, said sleeve having a closed end, a frustoconical inwardly-tapered open end and a hollow interior extending longitudinally between said open and closed ends, said spherical ball captured within said hollow interior and engaging said open end, and said compression spring positioned within said hollow interior between said closed end and said spherical ball for applying an axial spring force to said spherical ball directed substantially parallel to a longitudinal axis of said sleeve, wherein contact with the second surface of the wafer deflects said spherical ball against the axial spring force from engagement with said open end to thereby apply a clamping force against the second surface of the wafer.

13. The clamp ring assembly of claim 11, wherein said second rolling element is a spherical ball and said supporting roller assembly includes a compression spring and a thin-walled sleeve, said sleeve having a closed end, a frustoconical inwardly-tapered open end and a hollow interior extending longitudinally between said open and closed ends, said spherical ball captured within said hollow interior and engaging said open end, and said compression spring positioned within said hollow interior between said closed end and said spherical ball for applying an axial spring force to said spherical ball directed substantially parallel to a longitudinal axis of said sleeve, said spherical ball being deflected against the axial spring force from engagement with said open end to rollingly engage said inclined surface.

14. The clamp ring assembly of claim 11, wherein each inclined surface includes:
  a first detent positioned to receive said second rolling element of said supporting roller assembly of one of said plurality of latch assemblies when said latch body is in the latched position; and
  a second detent positioned to receive said second rolling element of said supporting roller assembly of one of said plurality of latch assemblies when said latch body is in the unlatched position.

15. The clamp ring assembly of claim 11, wherein said latch body has a cylindrical bore into which said mounting post is inserted and said clamp ring includes a mounting member, said mounting member positioned between said mounting post and said cylindrical bore and an outer circumference of said mounting member carrying one of said plurality of inclined surfaces.

16. The clamp ring assembly of claim 11, wherein said mounting post is removably mountable to said clamp ring.

17. The clamp ring assembly of claim 11, wherein said first rolling element contacts the second surface of the wafer over an arc length of less than about three angular degrees of the pivot arc near the latched position.

18. The clamp ring assembly of claim 17, wherein said first rolling element contacts the second surface of the wafer over an arc length of less than about one angular degree of the pivot arc near the latched position.

19. The clamp ring assembly of claim 11, wherein an axial position of said clamping roller assembly is axially adjustable within said latch body relative to a plane containing the wafer, the axial position being adjusted according to the thickness of the wafer to be held by the wafer holder for minimizing the arc length of the pivot arc over which said first rolling element applies a clamping force to the second surface of the wafer.

20. The clamp ring assembly of claim 11, wherein each of said plurality of latch assemblies is positioned on said clamp ring such that said latch body does not occlude the first circular opening when said latch body is oriented in the unlatched position.

21. The clamp ring assembly of claim 11, wherein each of said plurality of latch assemblies further comprises a pair of ball bearings disposed between said mounting post and said latch body, said pair of ball bearings significantly reducing the amount of force need to rotate said latch body between the latched and the unlatched positions.

22. The clamp ring of claim 11, wherein said clamping roller assembly and said clamping roller assembly are individually and independently movable relative to said latch body.

23. A wafer holder for holding a wafer in a semiconductor processing machine, comprising:
   a support frame having an inner peripheral edge defining a first circular opening, said first circular opening being diametrically larger than the diameter of the wafer and having a central axis;
   a clamp ring attached to said support frame, said clamp ring having a face facing said support frame and an inner peripheral flange defining a second circular opening, said second circular opening being diametrically smaller than the diameter of the wafer and being substantially centered with said central axis, said inner peripheral flange having a wafer-engaging surface for contacting a first surface of the wafer when the wafer is inserted into said first opening and a plurality of inclined surfaces located adjacent said first opening and positioned at spaced angular positions about said central axis, each of said plurality of inclined surfaces ascending radially outwardly away from said central axis; and
   a plurality of latch assemblies mounted to said clamp ring at one of said spaced angular positions, each of said plurality of latch assemblies including:
      a mounting post mounted to said inner peripheral flange of said clamp ring;
      a latch body rotatably carried on said mounting post, said latch body rotatable through a pivot arc between a latched position and an unlatched position;
      a clamping roller assembly mounted to said latch body, said clamping roller assembly having a resiliently-biased first rolling element adapted to apply a clamping force to a second surface of the wafer operable to capture the wafer between said first rolling element and said wafer-engaging surface of said inner peripheral flange when said latch body is in the latched position; and
      a supporting roller assembly mounted to said latch body and having a resiliently-biased second rolling element that rollingly engages one of said plurality of inclined surfaces, wherein the rolling engagement between said second rolling element and said inclined surface separates said first rolling element from the second surface of the wafer in a non-contacting manner until said latch body is substantially in the latched position.

24. The wafer holder of claim 23, wherein said first rolling element is a spherical ball and said clamping roller assembly includes a compression spring and a thin-walled sleeve, said sleeve having a closed end, a frustoconical inwardly-tapered open end, and a hollow interior extending longitudinally between said open and closed ends, said spherical ball captured within said hollow interior and engaging said open end, and said compression spring positioned within said hollow interior between said closed end and said spherical ball for applying an axial spring force to said spherical ball directed substantially parallel to a longitudinal axis of said sleeve, wherein contact with the second surface of the wafer deflects said spherical ball against the axial spring force from engagement with said open end to thereby apply a clamping force against the second surface of the wafer.

25. The wafer holder of claim 23, wherein said second rolling element is a spherical ball and said supporting roller assembly includes a compression spring and a thin-walled sleeve, said sleeve having a closed end, a frustoconical inwardly-tapered open end and a hollow interior extending longitudinally between said open and closed ends, said spherical ball captured within said hollow interior and engaging said open end, and said compression spring positioned within said hollow interior between said closed end and said spherical ball for applying an axial spring force to said spherical ball directed substantially parallel to a longitudinal axis of said sleeve, said spherical ball being deflected against the axial spring force from engagement with said open end to rollingly engage said inclined surface.

26. The wafer holder of claim 23, wherein each of said plurality of inclined surfaces includes:
   a first detent positioned to receive said second rolling element of said supporting roller assembly of one of said plurality of latch assemblies when each latch body is in the latched position; and
   a second detent positioned to receive said second rolling element of said supporting roller assembly of one of said plurality of latch assemblies when said latch body is in the unlatched position.

27. The wafer holder of claim 23, wherein said latch body has a cylindrical bore into which said mounting post is inserted and said clamp ring includes a mounting member, said mounting member positioned between said mounting post and said cylindrical bore and an outer circumference of said mounting member carrying one of said plurality of inclined surfaces.

28. The wafer holder of claim 23, wherein said mounting post is removably attachable to said clamp ring.

29. The wafer holder of claim 23, wherein said first rolling element contacts the second surface of the wafer over an arc length of less than about three angular degrees of the pivot arc near the latched position.

30. The wafer holder of claim 29, wherein said first rolling element contacts the second surface of the wafer over an arc length of less than about one angular degree of the pivot arc near the latched position.

31. The wafer holder of claim 23, wherein an axial position of said clamping roller assembly is axially adjustable within said latch body relative to a plane containing the wafer, the axial position being adjusted according to the thickness of the wafer to be held by said wafer holder for minimizing the arc length of the pivot arc over which the first rolling element applies a clamping force to the second surface of the wafer.

32. The wafer holder of claim 23, wherein each of said plurality of latch assemblies is positioned on said clamp ring such that said latch body does not occlude said first circular opening when said latch body is oriented in the unlatched position.

33. The wafer holder of claim 23, wherein said latch assembly further comprises a pair of ball bearings disposed between said mounting post and said latch body, said pair of ball bearings significantly reducing the amount of force need to rotate each latch body between the latched and the unlatched positions.

34. The wafer holder of claim 23, wherein said clamping roller assembly and said clamping roller assembly are individually and independently movable relative to said latch body.

* * * * *

UNITED STATES PATENT AND TRADEMARK OFFICE
CERTIFICATE OF CORRECTION

PATENT NO. : 6,652,656 B2
DATED : November 25, 2003
INVENTOR(S) : Kopacz et al.

It is certified that error appears in the above-identified patent and that said Letters Patent is hereby corrected as shown below:

<u>Title page,</u>
Item [*] Notice, delete the phrase "by 3days" and insert -- by 92 days --

Signed and Sealed this

Thirtieth Day of November, 2004

JON W. DUDAS
*Director of the United States Patent and Trademark Office*

UNITED STATES PATENT AND TRADEMARK OFFICE
CERTIFICATE OF CORRECTION

PATENT NO. : 6,652,656 B2
DATED : November 25, 2003
INVENTOR(S) : Stanislaw Kopacz and John Lawson It is certified that error appears in the above-identified patent and that said Letters Patent is hereby corrected as shown below:

Column 1,
Lines 46-47 read "...slide over the rim of the wafer As the latches move to a..." and should read -- "...slide over the rim of the wafer. As the latches move to a... --.

Column 5,
Lines 48-49 read "...inserting wafer 12 into, or removing wafer 12, from wafer holder 10." and should read -- ... inserting wafer 12 into, or removing wafer 12 from, wafer holder 10. --.

Column 7,
Lines 44-45 read "...the closed end 76 and the open end 78 rolling element 82 and a compression spring..." and should read -- ... the closed end 76 and the open end 78. Rolling element 82 and a compression spring --.

Column 12,
Lines 12-14 read "...and the exterior of the mounting post 118. the pair of the ball roller bearings significantly reducing the amount of force need to rotate each latch body between the latched position..." and should read -- ... and the exterior of the mounting post 118, the pair of the ball roller bearings significantly reducing the amount of force needed to rotate each latch body between the latched position --.

Column 13,
Line 55 reads "...from the scope or spirit of applicant's general inventive concept." and should read -- ... from the scope or spirit of applicants' general inventive concept. --.

Column 14,
Lines 57-61 read "5. The latch assembly of claim 1, wherein said rolling element of said clamping roller assembly engages the second surface of the wafer over an arc length of less than about three angular degrees of the pivot arc near the latched position." and should read -- S. The latch assembly of claim 1, wherein said first rolling element engages the second surface of the wafer over an arc length of less than about three angular degrees of the pivot arc near the latched position when said mounting post is mounted to the clamp ring. --.
Lines 62-65 read "6. The latch assembly of claim 5, wherein said rolling element of said clamping roller assembly engages the second surface of the wafer over an arc length of less than about one angular degree of the pivot arc near the latched position." and should read -- 6. The latch assembly of claim 5, wherein said first rolling element engages the second surface of the wafer over an arc length of less than about one angular degree of the pivot arc near the latched position when said mounting post is mounted to the clamp ring. --.

UNITED STATES PATENT AND TRADEMARK OFFICE
CERTIFICATE OF CORRECTION

PATENT NO.     : 6,652,656 B2
DATED          : November 25, 2003
INVENTOR(S)    : Stanislaw Kopacz and John Lawson It is certified that error appears in the above-identified patent and that said Letters Patent is hereby corrected as shown below:

Column 14, Lines 66-67, and Column 15, Lines 1-6,
Reads "7. The latch assembly of claim 1, wherein the position of said clamping roller assembly is axially adjustable within said latch body relative to a plane containing the wafer, the axial position being adjusted according to the thickness of the wafer to be held for minimizing the arc length of the pivot arc over which said rolling element of said clamping roller assembly applies to a clamping force to the second surface of the wafer." and should read -- 7. The latch assembly of claim 1, wherein an axial position of said clamping roller assembly is axially adjustable within said latch body relative to a plane containing the wafer, the axial position being adjusted according to the thickness of the wafer to be held for minimizing the arc length of the pivot arc over which said first rolling element applies a clamping force to the second surface of the wafer when said mounting post is mounted to the clamp ring. --.

Column 15,
Lines 7-12 reads "8. The latch assembly of claim 1, wherein the position of said supporting roller assembly is axially adjustable within said latch body relative to a plane containing the inclined surface, the axial position being adjusted so that said first rolling element is rollingly engaged with the inclined surface when said mounting post is mounted to the clamp ring." and should read -- 8. The latch assembly of claim 1, wherein an axial position of said supporting roller assembly is axially adjustable within said latch body relative to a plane containing the inclined surface, the axial position being adjusted so that said second rolling element is rollingly engaged with the inclined surface when said mounting post is mounted to the clamp ring. --.
Line 16 reads "...reducing the amount of force need to rotate said latch body..." and should read -- ...reducing the amount of force needed to rotate said latch body... --.
Lines 19, reads "...roller assembly and said clamping roller assembly are..." and should read -- ...roller assembly and said supporting roller assembly are... --.

Column 16,
Line 5, reads "...inwardly-tapered open end and a hollow interior..." and should read -- ...inwardly-tapered open end, and a hollow interior --.
Line 21, reads "...inwardly-tapered open end and a hollow interior..." and should read -- ...inwardly-tapered open end, and a hollow interior --.

UNITED STATES PATENT AND TRADEMARK OFFICE
CERTIFICATE OF CORRECTION

PATENT NO. : 6,652,656 B2
DATED : November 25, 2003
INVENTOR(S) : Stanislaw Kopacz and John Lawson It is certified that error appears in the above-identified patent and that said Letters Patent is hereby corrected as shown below:

Column 17,
Line 8, reads "... the amount of force need to rotate said latch body between..." and should read -- ... the amount of force needed to rotate said latch body between... --.
Lines 10-11, read "22. The clamp ring of claim II, wherein said clamping roller assembly and said clamping roller assembly are individually and independently movable relative to said latch body." and should read -- The clamp ring of claim 11, wherein said clamping roller assembly and said supporting roller assembly are individually and independently movable relative to said latch body. --.

Column 18,
Line 10, reads "...inwardly-tapered open end and a hollow interior extending..." and should read -- ...inwardly-tapered open end, and a hollow interior extending --.
Lines 59-60, read "...reducing the amount of force need to rotate each latch body..." and should read -- ...reducing the amount of force needed to rotate each latch body --.
Lines 62-65, read "34. The wafer holder of claim 23, wherein said clamping roller assembly and said clamping roller assembly are individually and independently movable relative to said latch body." and should read -- 34. The wafer holder of claim 23, wherein said clamping roller assembly and said supporting roller assembly are individually and independently movable relative to said latch body." --.

Signed and Sealed this

Twenty-eighth Day of June, 2005

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,652,656 B2 |
| APPLICATION NO. | : 09/911675 |
| DATED | : November 25, 2003 |
| INVENTOR(S) | : Kopacz et al. |

It is certified that error appears in the above-identified patent and that said Letters Patent is hereby corrected as shown below:

Column 12, line 14, after "position" insert --...--.

Claim 5, column 14, line 57, change "S." to --5.--.

Claim 22, column 17, line 10, before "The" insert --22.--.

Signed and Sealed this

Twenty-third Day of October, 2007

JON W. DUDAS
*Director of the United States Patent and Trademark Office*